(12) United States Patent
Lewis

(10) Patent No.: US 8,294,502 B2
(45) Date of Patent: Oct. 23, 2012

(54) DELAY CIRCUITRY

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 103 days.

(21) Appl. No.: 13/041,309

(22) Filed: Mar. 4, 2011

(65) Prior Publication Data

US 2012/0223754 A1   Sep. 6, 2012

(51) Int. Cl.
*H03H 11/26* (2006.01)
(52) U.S. Cl. .................. 327/261; 327/264; 327/299
(58) Field of Classification Search ............... 327/261, 327/263, 264, 276, 278, 291, 292, 299
See application file for complete search history.

(56) References Cited

U.S. PATENT DOCUMENTS

| | | | |
|---|---|---|---|
| 5,479,111 A * | 12/1995 | Matsuura | 326/24 |
| 5,566,129 A * | 10/1996 | Nakashima et al. | 365/233.5 |
| 5,708,381 A | 1/1998 | Higashisaka | |
| 6,044,026 A | 3/2000 | Morgan | |
| 6,320,437 B1 * | 11/2001 | Ma | 327/175 |
| 6,400,641 B1 | 6/2002 | Manning | |
| 6,476,655 B2 * | 11/2002 | Yahiro | 327/172 |
| 2010/0254197 A1 | 10/2010 | Moore | |

OTHER PUBLICATIONS

Ravi et al., U.S. Appl. No. 12/814,344 filed Jun. 11, 2010.
Chan et al., U.S. Appl. No. 12/909,781 filed Oct. 21, 2010.

* cited by examiner

*Primary Examiner* — An Luu
(74) *Attorney, Agent, or Firm* — Treyz Law Group; Jason Tsai

(57) ABSTRACT

Integrated circuits with delay circuitry are provided. Delay circuitry may receive a clock signal and generate a corresponding delayed clock signal. The delayed clock signal generated using the delay circuitry may exhibit reduced duty cycle distortion in comparison to conventional systems. The delay circuitry may include a pulse generation circuit, a delay circuit, and a latching circuit. The pulse generation circuit may generate pulses in response to detecting rising edges or falling edges at its input. The pulses may propagate through the delay circuit. The latching circuit may generate (reconstruct) a delayed version of the clock signal in response to receiving the pulses at its control input. The delay circuitry may be used in duty cycle distortion correction circuitry, delay-locked loops, and other control circuitry.

21 Claims, 11 Drawing Sheets

DELAY CIRCUITRY

BACKGROUND

Integrated circuits often include delay chains that are used to provide timing delays. For example, integrated circuits may include delay-locked loops having delay chains. These delay chains can be adjusted so that their delays are matched to a reference delay. Other delay chains are adjusted so that their delays are multiples or fractions of a reference delay.

Conventional delay chains are formed to provide equal rise and fall delays. Examples of conventional delay chains include chains of current-starved inverters, chains of shunt capacitor inverters, and delay interpolators. These delay chains provide adjustable delays that are controlled by digital control signals or analog control signals. As an example, a given chain of current-starved inverters may receive at its input a clock signal with a 25% duty cycle. The given chain should generate at its output a delayed version of the clock signal with a 25% duty cycle if the rise and fall delays are matched.

Modern integrated circuits may suffer from aging effects such as bias temperature instability (BTI). Such aging effects may cause the behavior of transistors to degrade over time (i.e., transistors may exhibit threshold voltage increases and a corresponding decrease in performance).

Integrated circuits such as programmable integrated circuits often include delay chains. Programmable integrated circuits have memory elements that are loaded with configuration data. The memory elements that are loaded with configuration data supply corresponding static control signals. The delay chains on a programmable integrated circuit may receive the static control signals for long periods of time (e.g., static control signals may have fixed polarities for at least six months). Transistors in the delay chains are subject to aging effect if the delay chains are stressed with static signals under extended periods of time, thereby causing the delay chains to exhibit different rising and falling delays. If these delay chains are used to delay clock signals, the delayed clock signals will undesirably suffer from duty cycle distortion.

As an example, a given chain of shunt capacitor inverters may receive at its input a clock signal with a 50% duty cycle. The given chain exhibits different rise and fall delays as a result of aging effects. The given chain will therefore generate at its output a distorted version of the clock signal, e.g., with a 55% duty cycle, if the rise and fall delays are unmatched.

SUMMARY

Integrated circuits may include delay circuitry. The delay circuitry may be formed as a part of a delay-locked loop, duty cycle distortion (DCD) correction circuitry, control circuitry that supports double-date-rate architectures, and other circuits. The delay circuitry may be used to delay clock signals while providing reduced duty cycle distortion (e.g., the delay circuitry may receive an input clock signal and generate a delayed version of the input clock signal with reduced duty cycle distortion).

In one suitable arrangement, the delay circuitry may include a pulse generation circuit, a delay circuit, a latching circuit, and control circuitry. The pulse generation circuit may be used to generate a pulse in response to the input signal clocking high or clocking low. The delay circuit may receive the pulse and generate a delayed version of the pulse.

The latching circuit may be a level sensitive latch or an edge-triggered flip-flop (as an example). The latching circuit may have a first input that receives the input clock signal, a second input that receives the delayed pulse through the delay circuit, and an output at which the delayed clock signal is provided. The control circuitry may be used to adjust the delay through the delay circuit. If desired, the first input of the latching circuit may receive a delayed version of the input clock signal through an additional delay circuit.

In another suitable arrangement, the delay circuitry may include a pulse generation circuit, first and second delay circuits, a latching circuit, and control circuitry. The pulse generation circuit may be used to generate a first pulse signal in response to the input signal rising (e.g., in response to detecting a positive clock edge) and to generate a second pulse signal in response to the input signal falling (e.g., in response to detecting a negative clock edge). The first delay circuit may receive the first pulse signal and generate a delayed version of the first pulse signal. The second delay circuit may receive the second pulse signal and generate a delayed version of the second pulse signal.

The latching circuit may be a set-reset latch (as an example). The latching circuit may have a first input that receives the delayed version of the first pulse signal through the first delay circuit, a second input that receives the delayed version of the second pulse signal through the second delay circuit, and an output at which the delayed clock signal is provided. The control circuitry may be used to adjust and equalize the delay through the first and second delay circuits.

Further features of the present invention, its nature and various advantages will be more apparent from the accompanying drawings and the following detailed description.

DETAILED DESCRIPTION

The embodiments of the present invention relate to integrated circuits with delay circuitry that provides approximately equal rise and fall delays. Integrated circuits may include digital signal processing circuits, microprocessors, application specific integrated circuits, memory chips, programmable logic device integrated circuits, or any other suitable integrated circuits.

Programmable integrated circuits such as programmable logic device integrated circuits use programmable memory elements to store configuration data. During programming operations of a programmable integrated circuit, configuration data is loaded into the memory elements. During normal operation of the programmable integrated circuit, each memory element may provide a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
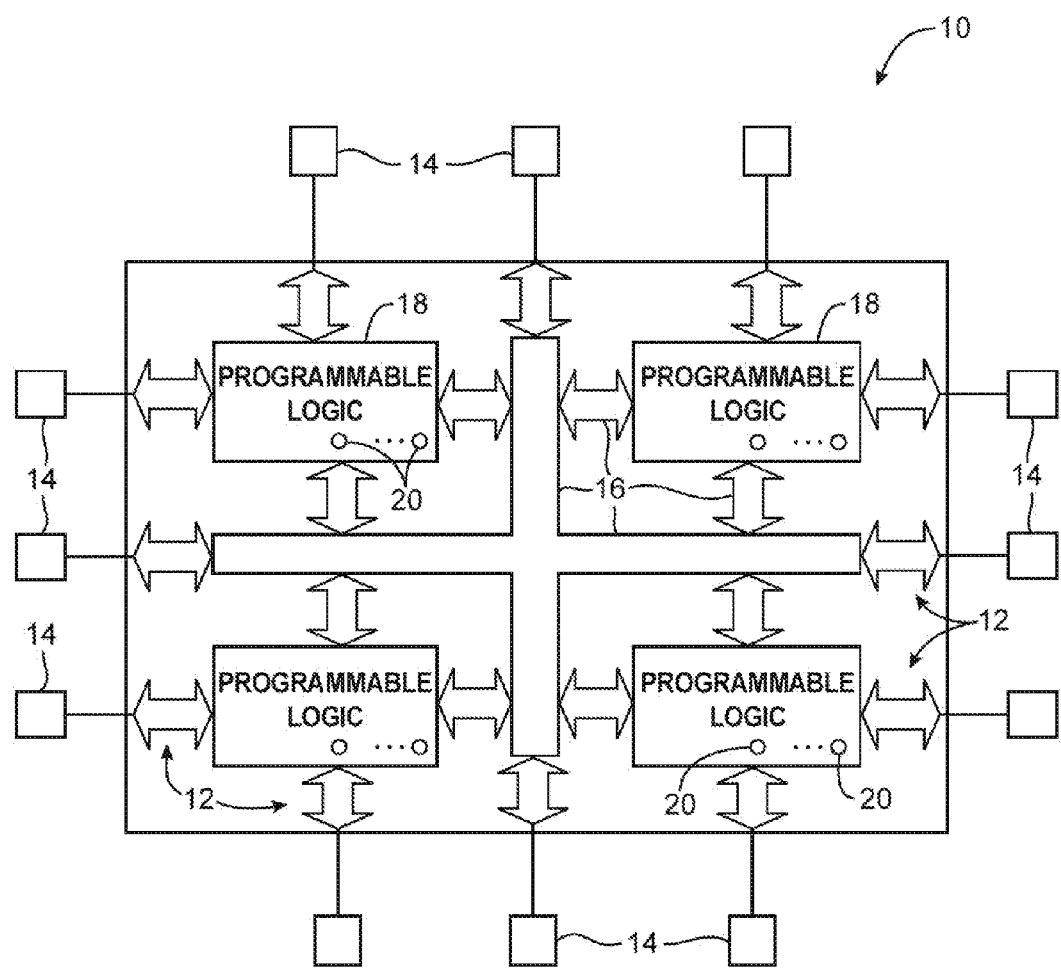
FIG. 1 is a diagram of an illustrative integrated circuit with an array of memory cells such as a programmable integrated circuit in accordance with an embodiment of the present invention.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and I/O circuitry 12. Once loaded, the memory elements may each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Device 10 may have circuits such as delay-locked loops (DLLs), duty cycle correction (DCC) circuits, input-output (I/O) circuits, and other control circuitry that include delay circuits. The delay circuits may be adjusted to provide a desired amount of delay. For example, a delay circuit may be used to provide a timing delay that is a multiple or a fraction of a reference delay.

Conventional delay chains may be subject to aging effects and may suffer from different rising and falling delays. Clock signals that are passed through delay chains with unmatched rise and fall delays may undesirably suffer from duty cycle distortion. It may therefore be desirable to be able to provide delay circuitry with matched (equal) rising and falling delays.

Figure 2:
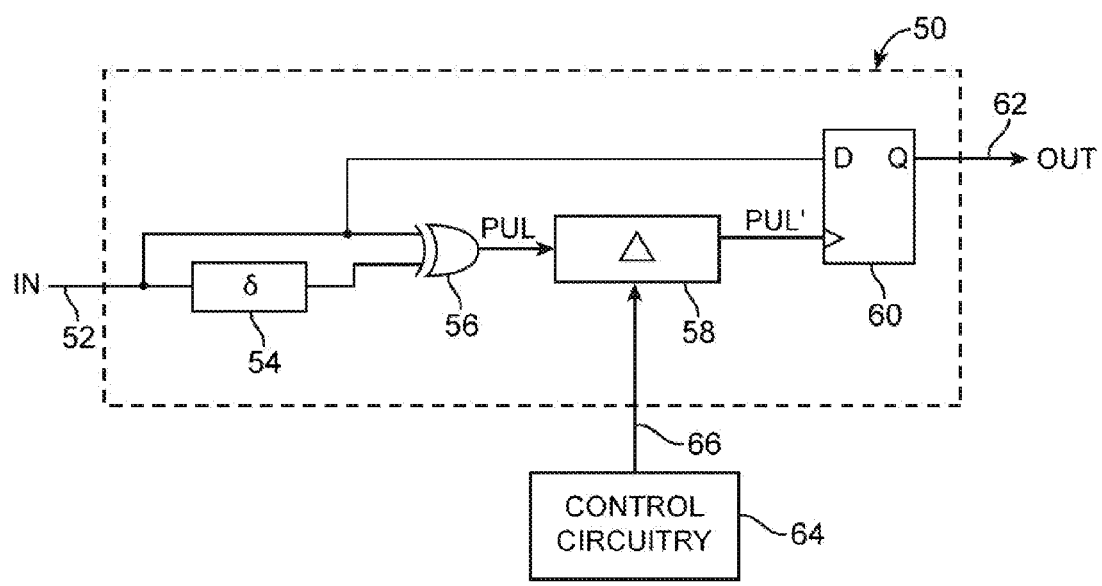
FIG. 2 is circuit diagram of illustrative delay circuitry having an adjustable delay in accordance with an embodiment of the present invention.

FIG. 2 is a circuit diagram of illustrative delay circuitry that is insensitive to aging effects. As shown in FIG. 2, delay circuitry 50 may include a first delay circuit 54, a second delay circuit 58, a logic gate such as logic XOR gate 56, and a latch 60. Latch 60 may be an edge-triggered flip-flop (e.g., a positive-edge-triggered flip-flop or a negative-edge-triggered flip-flop) or a level-sensitive latch (e.g., a positive level-sensitive latch or a negative level-sensitive latch).

Delay circuitry 50 may have an input 52 and an output 62. Input 52 may receive input signal IN, whereas output signal OUT may be supplied at output 62.

Delay circuit 54 may be used to introduce a pulse-width delay Tδ. Delay circuit 54 may have an input and an output. The input of delay circuit 54 may be connected to input 52. Delay circuit 54 may be formed from inverter chains, delay interpolators, or other types of delay elements.

Logic XOR gate 56 may have first and second inputs and an output. The first input of gate 56 may be connected to input 52, whereas the second input of gate 56 may be connected to the output of delay circuit 54. Connected using this arrangement, gate 56 may generate at its output a pulse (e.g., signal PUL) with a pulse width of Tδ in response to a signal transitioning from low to high or from high to low at input 52. Delay circuit 54 and gate 56 may therefore collectively be referred to as a pulse generation circuit (e.g., the pulse generation circuit of FIG. 2 may be triggered to generate a pulse in response to positive edges and negative edges of an input waveform at input 52). Other pulse generation circuits that can generate pulses in response to both rising and falling edges at its input may be used, if desired.

Delay circuit 58 may serve to provide the desired signal delay introduced by delay circuitry 50. Delay circuit 58 may have an input and an output. The input of delay circuit 58 may receive signal PUL. Delay circuit 58 may be used to introduce a desired timing delay TΔ. For example, signal PUL may have a rising edge at time t0. A delayed version of signal PUL may be generated at the output of delay circuit 58. In particular, the rising edge of delayed pulse signal PUL' may be delayed by TΔ following time t0. Delay circuit 58 may be formed from inverter chains, delay interpolators, or other types of delay elements.

Latch 60 may serve to generate a delayed version of input signal IN (e.g., to reconstruct the input signal with the desired amount of delay). Latch 60 may have an input D, an output Q, and a control input. Input D of latch 60 may receive input signal IN, whereas the control input of latch 60 may receive delayed pulse signal PUL'. Output Q of latch 60 may serve as output 62 of delay circuitry 50. Latch 60 may latch at its output Q the value of signal IN that is presented at its input D in response to signal PUL' rising (if latch 60 is a positive-edge triggered flip-flop) or while signal PUL' is pulsed high (if latch 60 is a level-sensitive latch).

As shown in FIG. 2, delay circuit 58 may receive control signals from control circuitry 64 over control line 66. Control circuitry 64 may adjust delay TΔ, thereby adjusting an overall signal delay provided by delay circuitry 50. The overall signal delay may be defined as the rising/falling delay experienced by a signal passing through delay circuitry 50 (e.g., the rising edges of signal OUT may be delayed by TΔ relative to corresponding rising edges of signal IN, whereas the falling edges of signal OUT may be delayed by TΔ relative to corresponding falling edges of signal IN). If desired, control circuitry 64 need not be included (e.g., delay circuitry 50 may provide non-adjustable delay). Control circuitry 64 may be formed as part of delay circuitry 50.

Delay circuitry 50 is tolerant to transistor aging effects, because both rising and falling transitions at input 52 triggers the same pulse signal that propagates through delay circuit 58 (e.g., pulses generated in response to positive edges and negative edges trigger the same sequence of transistor behavior). As a result, delay circuitry 50 may generate matched rise and fall delays in the presence of any transistor mismatch in delay circuits 54 and 58 and any local variations (e.g., process, voltage, and temperature variations). Using delay circuitry 50 to delay clock signals may, for example, provide reduced duty cycle distortion (e.g., the delayed clock signal at output 62 may have a duty cycle that is approximately equal to the duty cycle of the original clock signal received at input 52 of circuitry 50).

Figure 3:
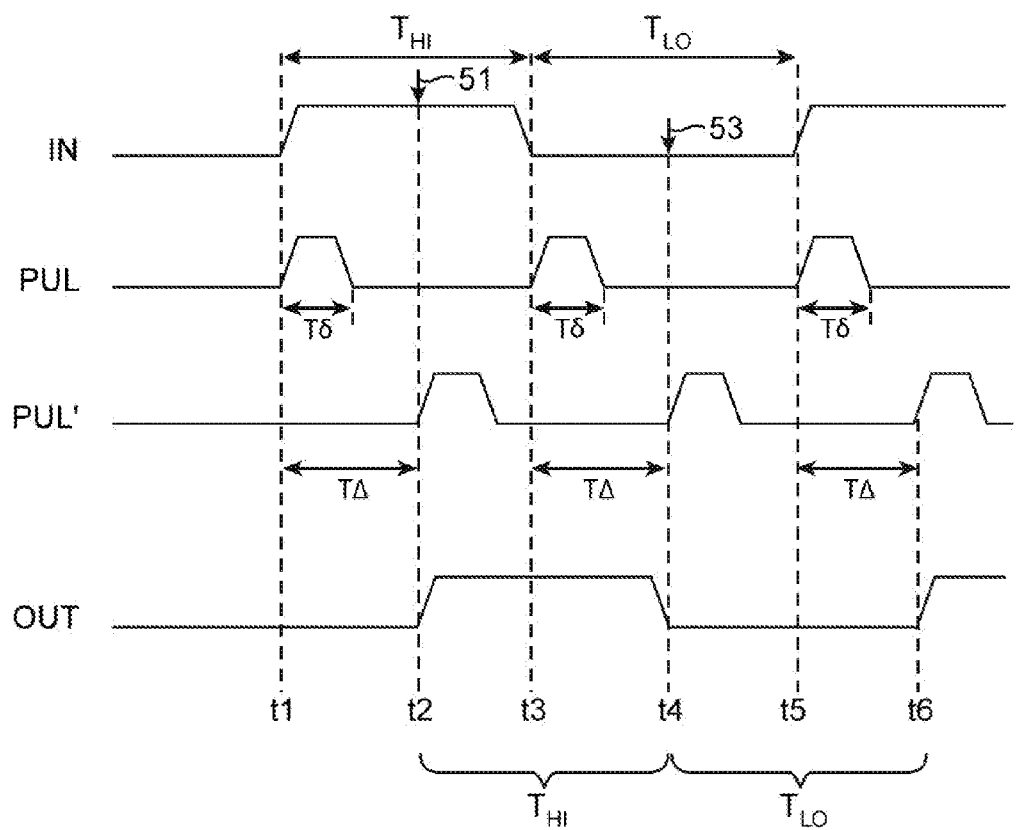
FIG. 3 is a timing diagram illustrating the behavior of relevant signals during the operation of the delay circuitry of FIG. 2 in accordance with an embodiment of the present invention.

FIG. 3 is a timing diagram illustrating the behavior of relevant signals during the operation of delay circuitry 50 of the type described in connection with FIG. 2. As shown in FIG. 3, signals IN (at input 52), PUL (at the output of gate 56), PUL' (at the control input of latch 60), and OUT (at output 62) may be low prior to time t1. Signal IN may be a square-wave clock signal with a 50% duty cycle (as an example).

At time t1, signal IN may be raised high. Signal IN rising high may trigger signal PUL to rise high. As shown in FIG. 3, the rising delay of logic XOR gate 56 may be negligible. Pulse signal PUL may be pulsed high for a period of Tδ. Delay Tδ may be relatively small compared to the clock cycle of clock signal IN (e.g., delay Tδ may be shorter than a quarter clock cycle).

At time t2, delayed pulse signal PUL' pulses high. This causes signal OUT to be raised high, because latch 60 samples (latches) a high input signal at time t2 (as indicated by arrow 51). As shown in FIG. 3, the rise delay of latch 60 may be negligible. The delay from the rising clock edge of signal IN to the rising clock edge of delayed signal PUL' (e.g., from time t1 to t2) may be equal to delay TΔ. Delay TΔ may be greater than delay Tδ (see, e.g., FIG. 3).

At time t3, signal IN may clock low. Signal IN falling low may trigger signal PUL to pulse high for Tδ. Pulse signal PUL triggered in response to a falling clock edge may be generated in the same way as the pulse signal triggered in response to the rising clock edge of time t1. The time period from the rising clock edge of IN to a successive falling clock edge of IN (e.g., from time t1 to t3) may be referred to as positive (high) clock phase $T_{HI}$.

At time t4, signal PUL' pulses high for Tδ. This causes signal OUT to be pulled low, because latch 60 latches a low input signal at time t4 (as indicated by arrow 53). The delay from the falling clock edge of signal IN to the corresponding rising clock edge of delayed signal PUL' (e.g., from time t3 to t4) may be equal to delay TΔ.

At time t5, signal IN clocks high to begin a successive clock cycle. The time period from the falling clock edge of IN to a successive rising clock edge of IN (e.g., from time t3 to t5) may be referred to as negative (low) clock phase $T_{LO}$. At time t6, signal OUT will clock high after delay TΔ following the rising clock edge of IN.

As shown in FIG. 3, signal OUT is a delayed version of clock signal IN. Delayed clock signal OUT at output 62 may be delayed by time TΔ relative to the original clock signal at input 52. The delayed clock signal may have a high clock phase $T_{HI}$ (e.g., from time t2 to t4) and a low clock phase $T_{LO}$ (e.g., from time t4 to t6) that is respectively equal to $T_{HI}$ and $T_{LO}$ of the original clock signal.

Delay circuit 54 may be subject to aging effects. This may cause pulse width Tδ to widen or shrink, because the performance of some of the transistors in delay circuit 54 has been degraded. The change in pulse width Tδ, however, does not affect delay TΔ. Delay circuit 58 may be designed with sufficient margin so that aging will not cause width Tδ to shrink to be too short to trigger latch 60 during operation of circuitry 50.

Delay circuitry 50 is capable of generating matched rise and fall delays, because delay TΔ triggered in response to either rising or falling edges is the same. Delaying a clock signal using this approach may therefore experience reduced duty cycle distortion in the presence of aging effects in comparison to conventional systems.

Delay circuitry 50 of FIG. 2 may not function properly if the desired delay TΔ exceeds high clock phase $T_{HI}$ or low clock phase $T_{LO}$. This is because latch 60 samples incorrect data since the state of signal IN will have changed when the pulse arrives at the control input of latch 60.

Figure 4:
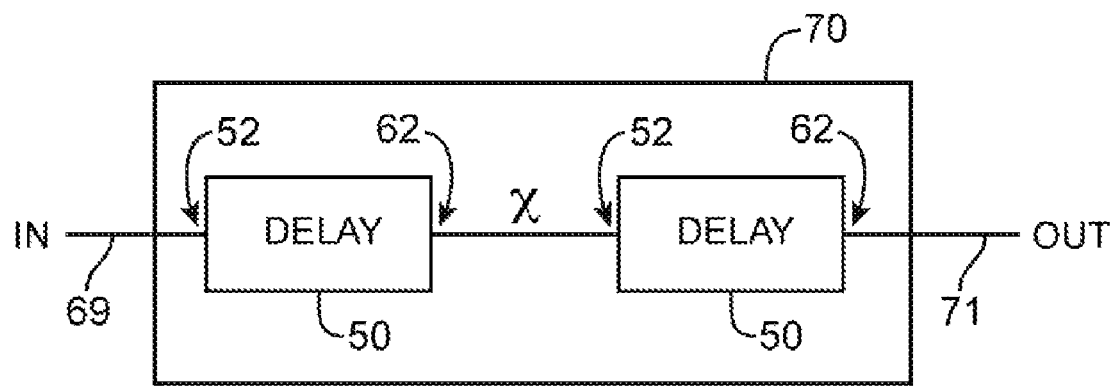
FIG. 4 is a circuit diagram of illustrative delay circuitry having a cascaded arrangement in accordance with an embodiment of the present invention.

FIG. 4 shows one suitable arrangement of delay circuitry that operates properly while providing delays TΔ that are longer than positive clock phase $T_{HI}$. As shown in FIG. 4, delay circuitry 70 may include two delay circuitry 50 cascaded in series. First delay circuitry 50 may have input 52 that forms an input 69 for delay circuitry 70 and output 62 that is coupled to input 52 of second delay circuitry 50. The signal generated at output 62 of first delay circuitry 50 may be represented by intermediate signal X.

Input 52 of second delay circuitry 50 may receive signal X. Second delay circuitry 50 may have output 62 that forms an output 71 for delay circuitry 70. For example, an original clock signal IN may be fed through input 69 of delay circuitry 70. Delayed clock signal OUT generated at output 71 may be a delayed version of original clock signal IN with a delay that is greater than a half clock cycle (as an example).

Figure 5:
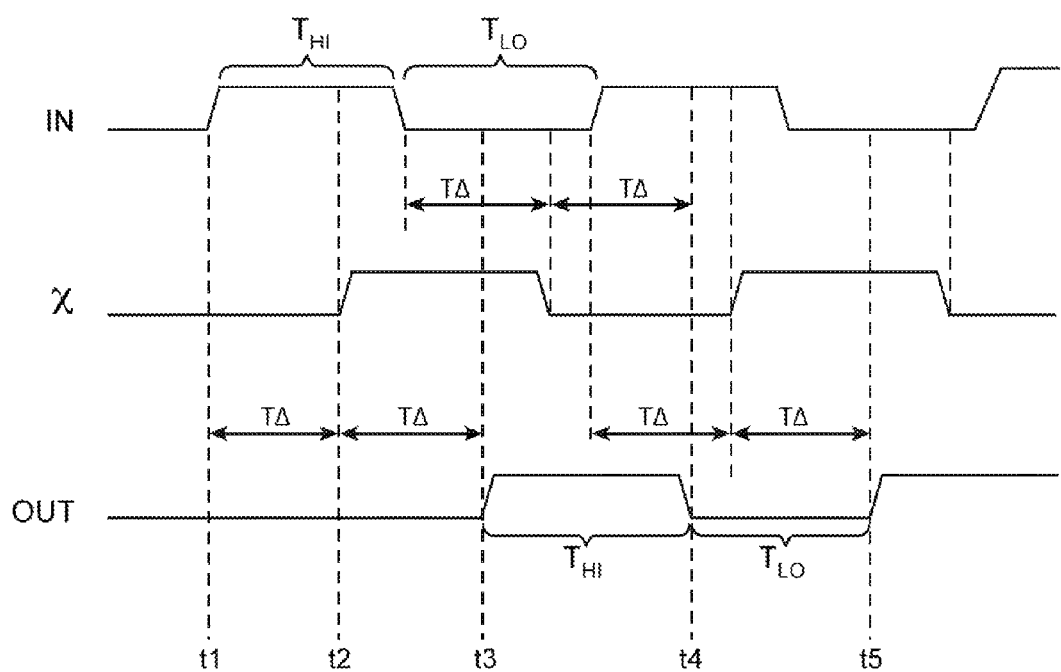
FIG. 5 is a timing diagram illustrating the behavior of relevant signals during the operation of the delay circuitry of FIG. 4 in accordance with an embodiment of the present invention.

FIG. 5 is a timing diagram illustrating the behavior of relevant signals during operation of delay circuitry 70. At time t1, original clock signal IN may clock high. After first delay TΔ, intermediate signal X clocks high (at time t2). Signal X may be a delayed version of original clock signal IN that is delayed by TΔ.

At time t3, delayed clock signal OUT clocks high. As shown in FIG. 5, signal OUT clocks high after first delay TΔ (e.g., a delay provided by first delay circuitry 50) and after second delay TΔ (e.g., a delay provided by second delay circuitry 50). Signal OUT therefore clocks high after an overall delay of 2TΔ following the first rising clock edge of signal IN. At time t4, signal OUT clocks low after a delay of 2TΔ following the first falling clock edge of signal IN. At time t5, signal OUT clocks high to begin a successive clock cycle after a delay of 2TΔ following the second rising clock edge of signal IN. The delays of first and second delay circuitry 50 need not be identical as long as their delays sum to a desired value.

Delay circuitry 70 configured using this approach may therefore provide an overall delay (e.g., a delay of 2TΔ) that is greater high clock phase $T_{HI}$. The arrangement of FIG. 4 is merely illustrative. Delay circuitry 70 may include more than two delay circuitry 50 coupled in series to provide the desired amount of delay through delay circuitry 70.

Figure 6:
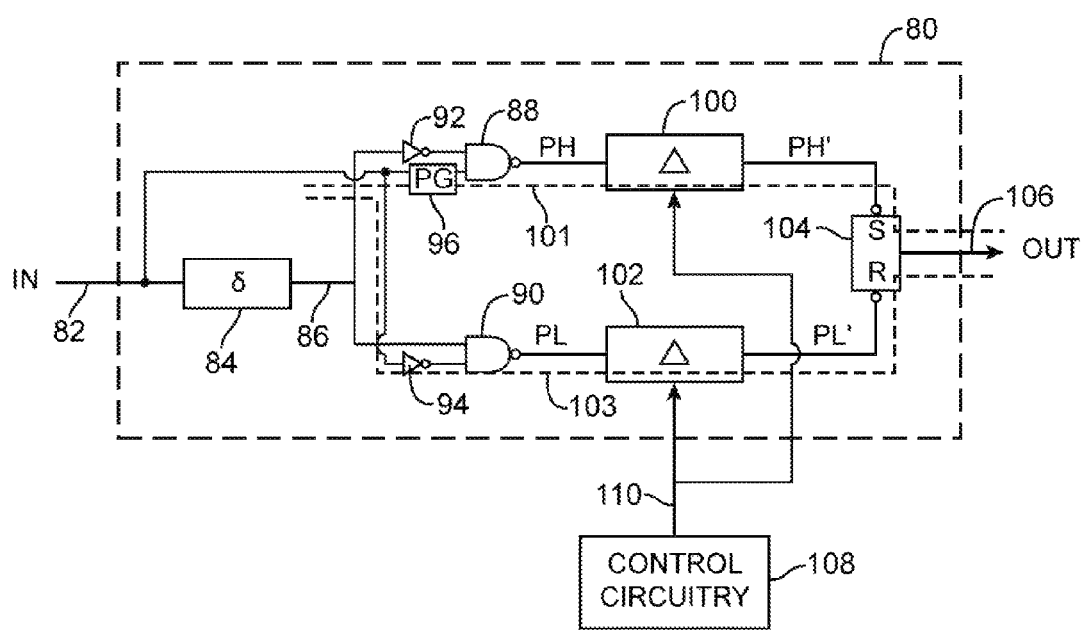
FIG. 6 is a circuit diagram of illustrative delay circuitry with first and second pulse generation circuits in accordance with an embodiment of the present invention.

FIG. 6 shows another suitable arrangement of delay circuitry that operates properly while providing delays TΔ that are greater than high clock phase $T_{HI}$ or greater than a half clock cycle. Delay circuitry 80 may be configured to propagate rising pulse signals (e.g., pulse signals triggered in response to rising clock edges) and falling pulse signals (e.g., pulse signals triggered in response to falling clock edges) through distinct delay paths (e.g., the rising pulse signals are propagated through first delay path 101, whereas the falling pulse signals are propagated through second delay path 103). Delay circuitry 80 can operate properly as long as the pulse signals propagate through delay paths 101 and 103, even if desired delay TΔ is greater than high clock phase $T_{HI}$.

As shown in FIG. 6, delay circuitry 80 may include a first delay circuit 100, a second delay circuit 102, a latch such as set-reset (SR) latch 104, and pulse generation circuitry (e.g., pulse delay circuit 84 and associated logic circuitry).

Delay circuitry 80 may have an input 82 and an output 106. Input 82 may receive input signal IN, whereas output signal OUT may be supplied at output 106.

Delay circuit 84 may be used to introduce a pulse-width delay Tδ. Delay circuit 84 may have an input and an output (86). The input of delay circuit 84 may be connected to input 82. Delay circuit 84 may be formed from inverter chains, delay interpolators, or other types of delay elements.

The output of delay circuit 84 may be coupled to associated pulse generation circuitry such as logic NAND gates 88 and 90. Gates 88 and 90 may each have first and second inputs and an output. Output 86 of delay circuit 84 may be coupled to the first input of gate 88 through inverter 92 and to the first input of gate 90. Input 82 may be coupled to the second input of gate 88 through pass gate 96 and to the second input of gate 90 through inverter 94. Pass gate (sometimes referred to as a transmission gate) 96 associated with gate 88 may serve to provide a delay that is equal to the delay of inverter 94 associated with gate 90. Providing matching delays in this way may serve to equalize the rising and falling delays through delay paths 101 and 103, respectively. Pass gate 96 may be any suitable delay circuit.

Gate 88 and delay circuit 100 may be associated with first delay path 101 (e.g., a positive-edge-triggered pulse signal propagation path), whereas gate 90 and delay circuit 102 may be associated with second delay path 103 (e.g., a negative-edge-triggered pulse signal propagation path). Gate 88 may generate signal PH at its output, whereas gate 90 may generate signal PL at its output. Signal PH may be pulsed low in response to signal IN clocking high. Signal PL may be pulsed low in response to signal IN clocking low.

Delay circuit 100 may delay signal PH to generate delayed pulse signal PH', whereas delay circuit 102 may delay signal PL to generate delayed pulse signal PL'. Signal PH' may be delayed by TΔ relative to signal PH. Signal PL' may be delayed by TΔ relative to signal PL. The amount of delay experienced by signals PH' and PL' may be identical.

Set-reset latch 104 may have an inverting set input, an inverting reset input, and an output (i.e., output 106 of delay circuitry 80). For example, if the inverting set and reset inputs are both high, SR latch 104 will retain its previous latched value. If inverting set and reset inputs are low and high, respectively, SR latch 104 will drive its output high (e.g., SR latch 104 is placed in a "set" state). If inverting set and reset inputs are high and low, respectively, SR latch 104 will pull its output low (e.g., SR latch 104 is placed in a "reset" state). Inverting set and reset inputs should not be simultaneously low.

The inverting set input of latch 104 may receive signal PH', whereas the inverting reset input of latch 104 may receive signal PL'. In a first scenario in which signal PH' pulses low, signal PL' will be high during that time period. Signal OUT will therefore clock high because latch 104 is placed in the set state. In a second scenario in which signal PL' pulses low, signal PH' will be high during that time period. Signal OUT will therefore clock low because latch 104 is placed in the reset state. Delay circuitry 80 operates properly because latch 104 does not directly sample input signal IN. Latch 104 will reconstruct a delayed version of the input signal as long as rising pulse signals and falling pulse signals are propagated through paths 101 and 103, respectively (even if desired delay TΔ is greater than a half clock cycle).

It is possible that the delay through path 101 (e.g., the rising delay) and the delay through path 103 (e.g., the falling delay) differ as a result of transistor mismatch and random process variations. The transistors of in each of delay paths 101 and 103 are, however, subject to the same aging effects, because the transistors in each of delay paths 101 and 103 experience identical signal behaviors. If desired, control circuitry 108 may be used to calibrate delay TΔ of circuits 100 and 102 and to adjust and equalize their respective delays (e.g., by sending delay control signals to adjustable delay circuits 100 and 102 through control line 110).

Figure 7:
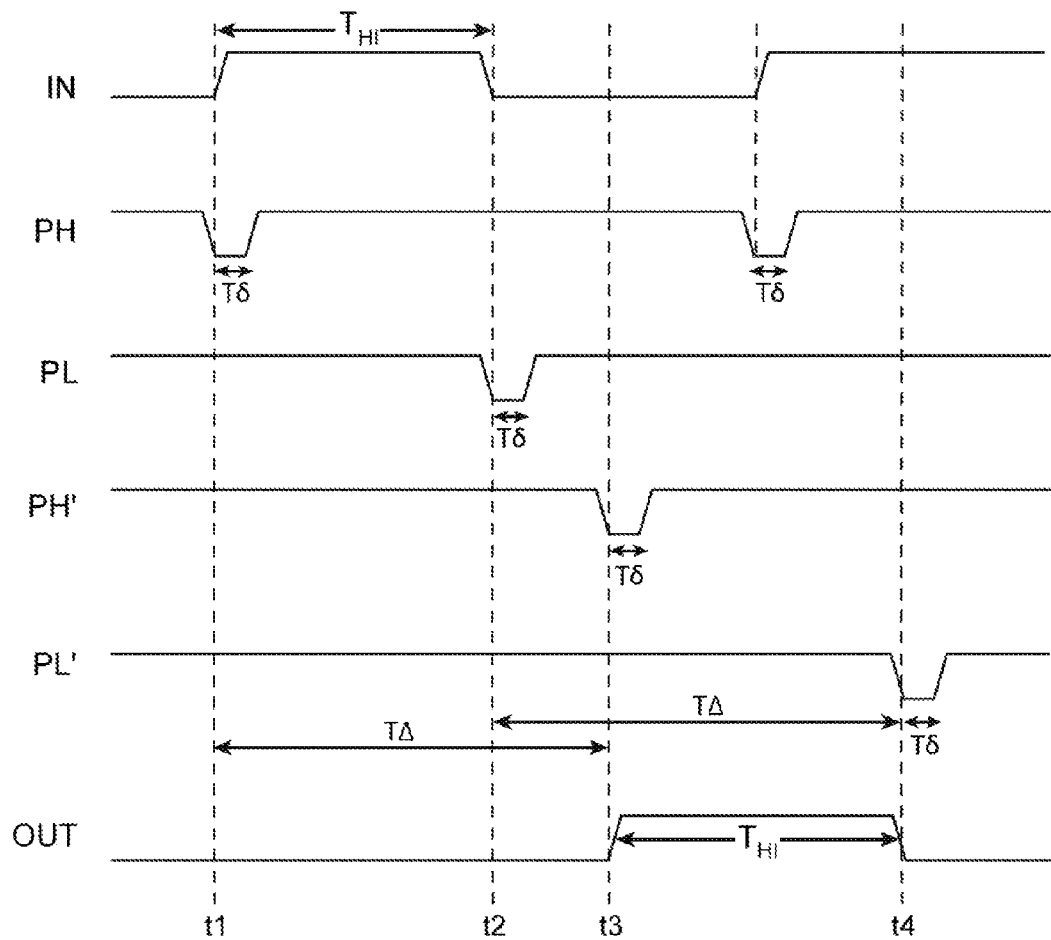
FIG. 7 is a timing diagram illustrating the behavior of relevant signals during the operation of the delay circuitry of FIG. 6 in accordance with an embodiment of the present invention.

FIG. 7 is a timing diagram illustrating the behavior of relevant signals during operation of delay circuitry 80. In particular, FIG. 7 shows a scenario in which desired delay TΔ is greater than high clock phase $T_{HI}$.

At time t1, original clock signal IN may clock high. Signal IN rising high may trigger signal PH to pulse low for a period of Tδ. At time t2, original clock signal IN may clock low. Signal IN falling low may trigger signal PL to pulse low for a period of Tδ.

At time t3, delayed pulse signal PH' pulses low. This causes signal OUT to be raised high, because SR latch 104 is placed in the set state. As shown in FIG. 7, the delay from the rising clock edge of signal IN to the falling clock edge of delayed signal PH' (e.g., from time t1 to t3) may be equal to delay TΔ. Delay TΔ may be greater than $T_{HI}$ (see, e.g., FIG. 7).

At time t4, delayed pulse signal PL' pulses low. This causes signal OUT to be driven low because SR latch 104 is placed in the reset state. The delay from the falling clock edge of signal IN to the falling clock edge of delayed signal PL' (e.g., from time t2 to t4) may be equal to delay TΔ.

As shown in FIG. 7, signal OUT is a delayed version of clock signal IN. Delayed clock signal OUT at output 106 may be delayed by TΔ relative to the original clock signal at input 82. The delayed clock signal may have a duty cycle that is approximately equal to the duty cycle of the original clock signal.

Figure 8:
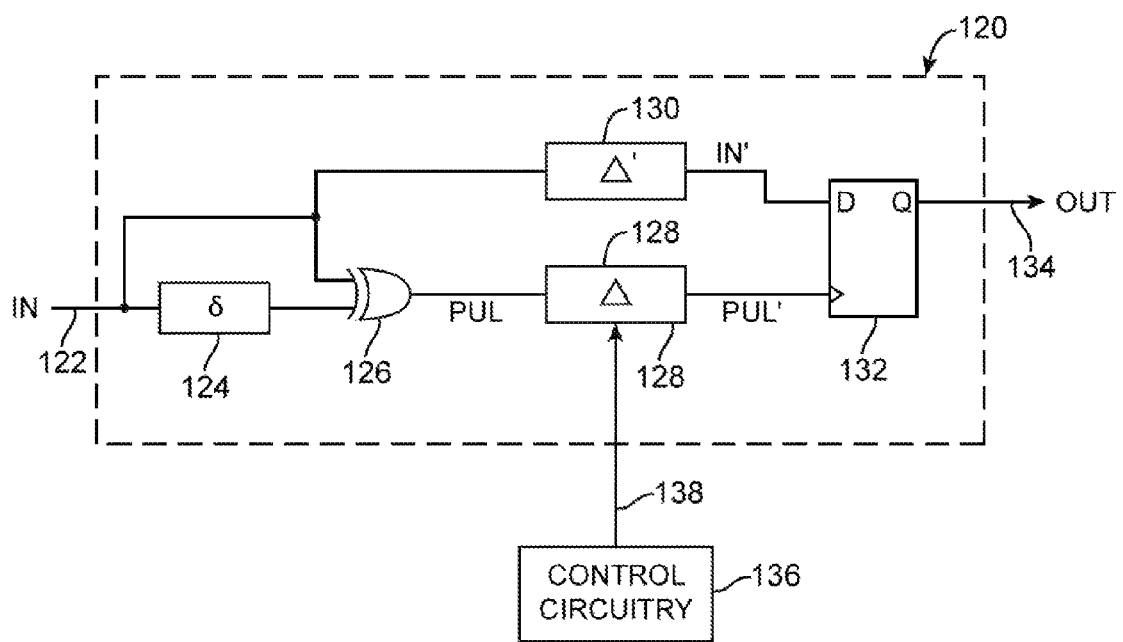
FIG. 8 is a circuit diagram of illustrative delay circuitry in accordance with an embodiment of the present invention.

FIG. 8 shows another suitable arrangement of delay circuitry that operates properly while providing delays TΔ that are greater than high clock phase $T_{HI}$. Delay circuitry 120 may be configured to delay the input signal such that a signal reconstructing element (e.g., a level sensitive latch or an edge-triggered flip-flop) samples correct data.

As shown in FIG. 8, delay circuitry 120 may include a pulse delay circuit 124, first and second delay circuits 128 and 130, a logic gate such as logic XOR gate 126, and a latch 132. Latch 132 may be an edge-triggered flip-flop (e.g., a positive edge-triggered flip-flop or a negative edge-triggered flip-flop) or a level-sensitive latch. Delay circuitry 120 may have an input 122 and an output 134. Input 122 may receive input signal IN, whereas output signal OUT may be supplied at output 134.

Delay circuit 124 may be used to introduce a pulse-width delay Tδ. Delay circuit 124 may have an input and an output. The input of delay circuit 124 may be connected to input 122. Delay circuit 124 may be formed from inverter chains, delay interpolators, or other types of delay elements.

Logic XOR gate 126 may have first and second inputs and an output. The first input of gate 126 may be connected to input 122, whereas the second input of gate 126 may be connected to the output of delay circuit 124. Connected using this arrangement, gate 126 may generate at its output signal PUL with a pulse width of Tδ in response to a signal transitioning from low to high or from high to low at input 122. Delay circuit 124 and gate 126 may therefore collectively be referred to as a pulse generation circuit. Other pulse generation circuits that can generate pulses in response to rising and/or falling edges at its input may be used, if desired.

Delay circuit 128 may serve to provide the desired signal delay TΔ. Delay circuit 128 may have an input and an output. The input of delay circuit 128 may receive signal PUL. Delay circuit 128 may be formed from inverter chains, delay interpolators, or other types of delay elements.

Delay circuit 130 may serve to provide a predetermined fraction of delay TΔ (e.g., circuit 130 may be used to provide delay TΔ'). Delay circuit 130 may have an input and an output. The input of delay circuit 130 may receive input signal IN. Delay circuit 130 may be formed from inverter chains, delay interpolators, or other types of delay elements.

Latch 132 may serve to generate a delayed version of input signal IN (e.g., to reconstruct the input signal that is delayed by TΔ). Latch 132 may have an input D, an output Q, and a control input. Input D of latch 132 may be coupled to the output of delay circuit 130, whereas the control input of latch 132 may be coupled to the output of delay circuit 128. Output Q of latch 132 may serve as output 134 of delay circuitry 120. Configured using this arrangement, latch 132 may sample at its output Q a delayed version of signal IN that is presented at its input D in response to signal PUL' rising. Latching the delayed version of the input signal allows latch 132 to sample correct data before the signal at input D toggles to an incorrect value.

For example, consider a scenario in which original clock signal IN has a clock period of 2000 ps. The original clock signal may be a square-wave clock signal with a 50% duty cycle (e.g., the original clock signal has a 1000 ps high clock phase $T_{HI}$ and a 1000 ps low clock phase $T_{LO}$). Delay TΔ of circuit 128 may be set to 1500 ps. In this example, the desired delay TΔ is greater than the high clock phase (1500 is greater than 1000).

Delay circuit 130 may provide TΔ' that is equal to 1125 ps (as an example). Delay TΔ' may be less than TΔ. Delaying the original clock signal using circuit 130 effectively enables latch 132 to sample the original clock signal 375 ps (1500 minus 1125) after the rising clock edge of the original clock signal. Sampling the original clock signal 375 ps after its rising clock edge may be desirable because the original clock signal remains high for 1000 ps after its rising clock edge (in this scenario).

Delay TΔ' of circuit 130 may vary in the presence of process, voltage, and temperature (PVT) variations. Delay circuitry 120 may operate properly as long as delay TΔ' varies within an acceptable range. In the example above, an acceptable delay TΔ' may range from 500 ps (TΔ minus $T_{HI}$) to an upper limit of 1500 ps (e.g., an upper limit that is equal to TΔ). Setting delay TΔ' of circuit 130 to be equal to an intermediate delay within the range of acceptable delays (e.g., a median delay value within the range of acceptable delay values) may allow for improved margins of error and tolerance to PVT variations.

As shown in FIG. 8, delay circuit 120 may receive control signals from control circuitry 136 over control line 138. Control circuitry 136 may adjust delay TΔ, thereby adjust the overall signal delay provided by delay circuitry 120. Delay circuit 130 need not be an adjustable delay circuit (e.g., delay TΔ' is fixed at a nominal value).

Figure 9:
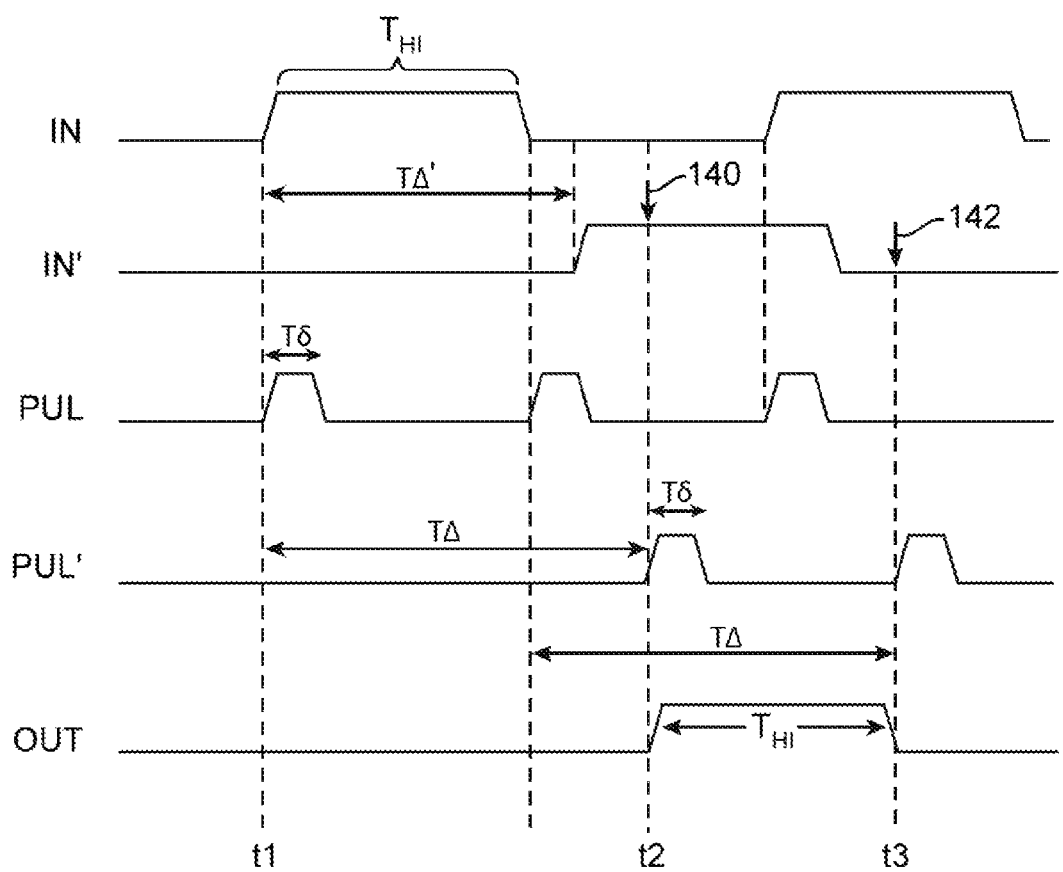
FIG. 9 is a timing diagram illustrating the behavior of relevant signals during the operation of the delay circuitry of FIG. 8 in accordance with an embodiment of the present invention.

FIG. 9 is a timing diagram illustrating the behavior of relevant signals during the operation of delay circuitry 120 of the type described in connection with FIG. 8. As shown in FIG. 9, signals IN (at input 122), PUL (at the output of gate 126), PUL' (at the control input of latch 132), and OUT (at output 134) may be low prior to time t1. Signal IN may be a square-wave clock signal with a duty cycle of 50% (as an example). Delay circuit 130 may generate a delayed version of signal IN. Delayed clock signal IN' may be delayed by TΔ' relative to signal IN (see, e.g., FIG. 9)

At time t1, signal IN may be raised high. Signal IN rising high may trigger signal PUL to pulse high for a period Tδ. At time t2, delayed pulse signal PUL' pulses high. This causes signal OUT to be raised high, because latch 132 samples a high delayed input signal IN' at time t2 (as indicated by arrow 140). The delay from the rising clock edge of signal IN to the rising clock edge of delayed pulse PUL' (e.g., from time t1 to t2) may be equal to delay TΔ. Delay TΔ may be greater than a half clock cycle (as an example).

At time t3, delayed pulse signal PUL' pulses high again. This causes signal OUT to be pulled low, because latch 132 samples a low delayed input signal IN' at time t3 (as indicated by arrow 142). The delay from the falling clock edge of signal IN to the rising clock edge of delayed signal PUL' (at time t3) may be equal to delay TΔ. Delaying the input signal by a fraction of the desired delay may therefore allow delay circuitry 120 to properly delay a square-wave clock signal by a delay greater than a half clock cycle while exhibiting reduced duty cycle distortion.

The delay circuitry of the type described in connection with FIGS. 5, 7, 9, and 11 may be used to delay clock signals while introducing reduced duty cycle distortion. Such delay circuitry may be used in circuits such as duty cycle distortion (DCD) correction circuitry, delay-locked loops (DLLs), double-date-rate memory input-output circuitry, and other clock control circuitry.

Figure 10:
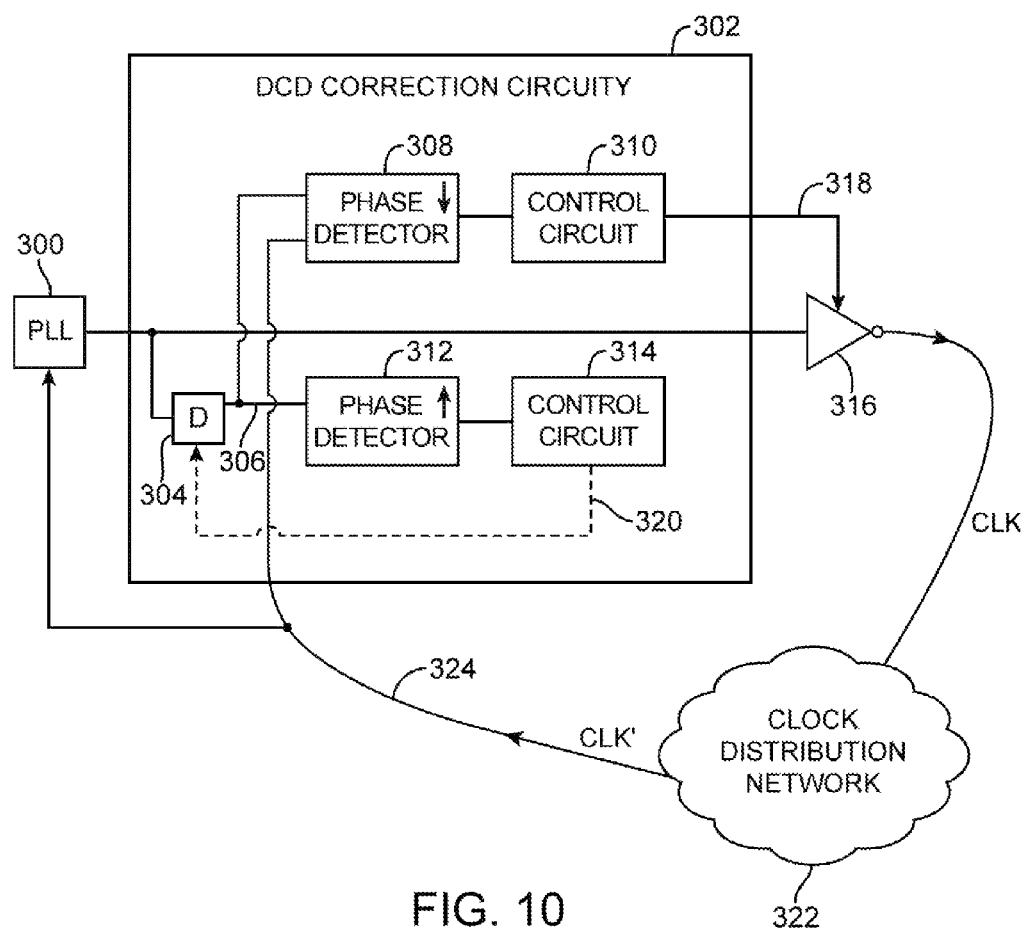
FIG. 10 is a diagram of illustrative duty cycle distortion correction circuitry that includes delay circuitry in accordance with an embodiment of the present invention.

As shown in FIG. 10, DCD correction circuitry 302 may include delay circuitry such as delay circuitry 304 that receives an original clock signal directly from a phase-locked loop (PLL) 300.

Phase-locked loop 300 may feed clock signal CLK to a clock buffer 316 that drives clock signal CLK onto a clock distribution network 322. Clock buffer 322 may be an inverting stage and may sometimes be referred to as a clock driver. Clock distribution network 322 may receive signal CLK from clock buffer 316 and may distribute clock signal CLK to different logic regions on integrated circuit 10. Network 322 may be arranged in a tree configuration (sometimes referred to as a clock tree). Network 322 may, for example, be an H-tree clock network. Use of an H-tree ensures that delays to different points in the logic circuitry are well matched.

Different logic regions may receive CLK' through clock distribution network 322. Local clock signal CLK' received at the different logic regions may experience duty cycle distortion (DCD) as the original clock signals are distributed through network 322, because of the presence of noise and other sources of random variations. Control circuitry such as DCD correction circuitry 302 may receive CLK' over line 324 and may be used to dynamically adjust clock buffer 316 (i.e., the clock buffer that is connected to the output of PLL 300) in real time to ensure that signal CLK' experiences reduced duty cycle distortion.

DCD correction circuitry 302 may include delay circuitry 304. Delay circuit 304 may output a delayed version of the clock signal generated by PLL 300 on line 306. Delay circuitry 304 may be implemented using the arrangement as shown in FIG. 2, 7, 9, or 11.

A first phase detector such as rising-edge (positive-edge) phase detector 312 may have a first input that receives the delayed clock signal over line 306 and may have a second input that receives signal CLK' over line 324. Rising-edge phase detector 312 may compare the rising edge of the two clock signals at its inputs and output a result that controls circuit 314 based on this comparison. For example, if the rising edge of the delayed clock signal on line 306 comes before the rising edge of CLK', then phase detector 312 may output a "0" to control circuit 314 (as an example). If the rising edge of the delayed clock signal on line 306 comes after the rising edge of CLK', then phase detector 312 might output a "1" to control circuit 314.

Control circuit 314 may be used to adjust the delay of circuit 304 such that the delayed clock signal provided on line 306 is phase-locked with CLK'. In other words, phase detector 312 and control circuit 314 connected in this feedback (loop) configuration may adjust the delay of circuit 304 so that the rising clock edges of the delayed signal on line 306 and CLK' are aligned (matched). Control block 314 may adjust delay circuit 304 to provide a delay that is approximately equal to the signal propagation delay through the clock distribution network. Delay circuit 304, phase detector 312, and control circuit 314 may sometimes be referred to as forming a delay-locked loop (DLL).

DCD correction circuitry 302 may further include a second phase detector such as falling-edge (negative-edge) phase detector 308 connected to control circuit 310. Falling-edge phase detector 308 may have a first input that receives the delayed clock signal over line 306 and may have a second input that receives signal CLK' over line 324. The rising edge of these two clock signals are already aligned by phase detector 312 and control circuit 314. Phase detector 308 may compare the falling edge of the two clock signals at its inputs and output a corresponding result to control circuit 310 based on the comparison. For example, if the falling edge of the delayed clock signal on line 306 comes before the falling edge of CLK', then phase detector 308 might output a "0" to control circuit 310 (as an example). If the falling edge of the delayed clock signal on line 306 comes after the falling edge of CLK', then phase detector 308 might output a "1" to control circuit 310.

The delayed clock signal on line 306 is a clock signal with the same duty cycle as the output of PLL 300, because delay circuit 304 can provide matched rising and falling delays. Control circuit 310 may therefore provide control signals on line 318 to control clock buffer 316 that is connected to the output of PLL 300. In particular, control circuit 310 may dynamically adjust the pull-down drive strength of buffer 316 to shift the falling edge of signal CLK' so that the falling edge of CLK' is aligned with the falling edge of the delayed clock signal on line 306.

Aligning both the rising edge and the falling edge of signal CLK' and the delayed clock signal on line 306 results in a situation in which signal CLK' exhibits reduced duty cycle distortion, because the delayed clock signal on line 306 has the same duty cycle as the PLL output (e.g., adaptively adjusting clock buffer 316 in this way effectively locks the high clock phase to a half clock cycle). As shown in FIG. 10, PLL 300 may also receive CLK' over line 324 to properly adjust its clock phase.

Figure 11:
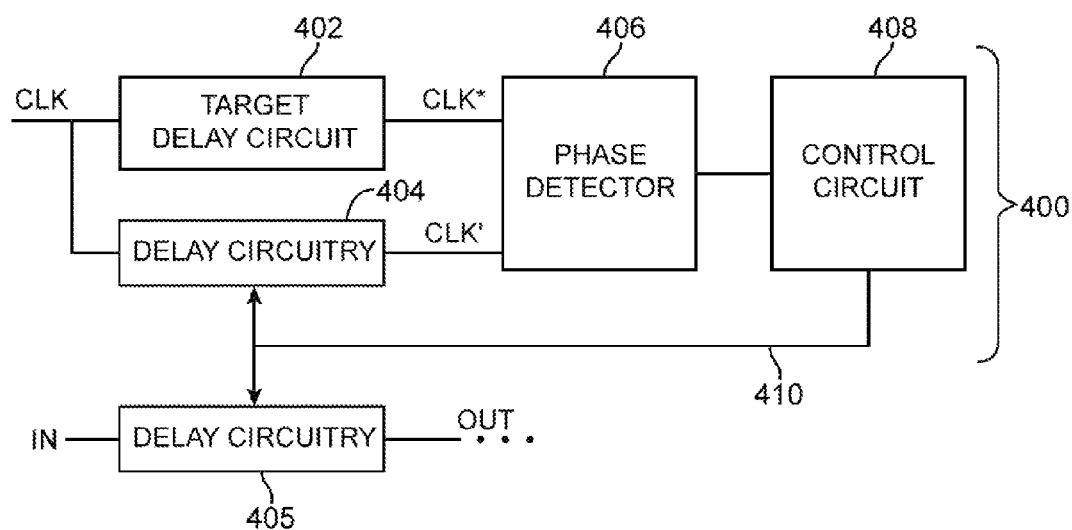
FIG. 11 is a diagram of an illustrative delay-locked loop in accordance with an embodiment of the present invention.

FIG. 11 is a diagram showing a delay-locked loop (DLL) that includes delay circuitry. As shown in FIG. 11, DLL 400 may include a target delay circuit 402, delay circuitry 404, phase detector 406, and control circuitry 408 connected in a loop. Delay circuitry 404 may be implemented using the arrangement as shown in FIG. 2, 7, 9, or 11.

DLL 400 may receive an original clock signal CLK. Target delay circuit 402 and delay circuitry 404 may each have an input that receives signal CLK. Circuit 402 may be used to delay signal CLK by a target delay (e.g., circuit 402 may generate delayed clock signal CLK* at its output). Delay circuitry 404 may be used to delay signal CLK by an adjustable delay (e.g., circuit 404 may generate delayed clock signal CLK' at its output).

Phase detector 406 may have a first input that receives signal CLK* and a second input that receives signal CLK'. Phase detector 406 may compare the rising edge of the two clock signals at its inputs and output a result that controls circuit 408 based on this comparison. For example, if the rising edge of CLK* comes before the rising edge of CLK', then phase detector 406 may output a "0" to control circuit 408 (as an example). If the rising edge of the CLK* comes after the rising edge of CLK', then phase detector 406 might output a "1" to control circuit 408.

Control circuit 408 may be used to adjust the delay of circuitry 404 such that the delay provided by delay circuitry 404 matches the target delay provided by circuit 402 (e.g., by sending delay control signals to circuitry 404 over line 410). Other delay circuits such as delay circuitry 405 (e.g., a replica of delay circuitry 404) may receive these control signals over line 410.

Configuring delay circuitry 405 in this way may allow delay circuitry 405 to delay a clock signal by the target timing delay while ensuring that the delayed clock signal generated at its output exhibits matched rise and fall delays. Delay circuitry 404 and 405 may generate signals at their outputs having matched rising/falling delays even if signals generated by target delay circuit 402 exhibit unequal rise and fall delays.

The foregoing is merely illustrative of the principles of this invention and various modifications can be made by those skilled in the art without departing from the scope and spirit of the invention.

What is claimed is:

1. An integrated circuit comprising:
   a pulse generation circuit operable to receive an input signal and operable to generate corresponding pulse signals;
   a delay circuit operable to receive the pulse signals from the pulse generation circuit; and
   a latching circuit operable to receive delayed versions of the pulse signals through the delay circuit, wherein the latching circuit is operable to output a delayed version of the input signal in response to receiving the delayed versions of the pulse signals.

2. The integrated circuit defined in claim 1 further comprising an additional delay circuit, a phase detector, and a control circuit, wherein the pulse generation circuit, the delay circuit, the latching circuit, the additional delay circuit, the phase detector, and the control circuit are coupled in a loop.

3. The integrated circuit defined in claim 2, wherein the latching circuit has a first input and a second input, wherein the first input of the latching circuit is operable to receive the input signal, and wherein the second input of the latching circuit is operable to receive the delayed versions of the pulse signals.

4. The integrated circuit defined in claim 2, wherein:
the pulse generation circuit is operable to generate corresponding first and second pulse signals;
the delay circuit comprises a first delay circuit operable to receive the first pulse signal and a second delay circuit operable to receive the second pulse signal; and
the latching circuit has a first input operable to receive a delayed version of the first pulse signal through the first delay circuit and a second input operable to receive a delayed version of the second pulse signal through the second delay circuit, wherein the latching circuit comprises a set-reset latch.

5. The integrated circuit defined in claim 1, wherein a first portion of a duty cycle distortion correction circuit comprises the pulse generation circuit, the delay circuit, and the latching circuit, and wherein a second portion of the duty cycle distortion correction circuitry comprises first and second phase detectors and control circuitry.

6. The integrated circuit defined in claim 5, wherein the latching circuit comprises a first input and a second input, wherein the first input of the latching circuit is operable to receive the input signal, and wherein the second input of the latching circuit is operable to receive the delayed versions of the pulse signals.

7. The integrated circuit defined in claim 5, wherein:
the pulse generation circuit is operable to generate corresponding first and second pulse signals;
the delay circuit comprises a first delay circuit operable to receive the first pulse signal and a second delay circuit operable to receive the second pulse signal; and
the latching circuit has a first input operable to receive a delayed version of the first pulse signal through the first delay circuit and a second input operable to receive a delayed version of the second pulse signal through the second delay circuit, wherein the latching circuit comprises a set-reset latch.

8. Delay circuitry comprising:
a pulse generation circuit operable to receive an input signal and operable to generate a corresponding pulse;
a delay circuit operable to receive the pulse; and
a latching circuit having a first input and a second input, wherein the first input is operable to receive the input signal, wherein the second input is operable to receive a delayed version of the pulse through the delay circuit, and wherein the latching circuit is operable to output a delayed version of the input signal in response to receiving the input signal and the delayed version of the pulse.

9. The delay circuitry defined in claim 8, wherein the pulse generation circuit comprises an additional delay circuit and a logic gate, wherein the additional delay circuit and the logic gate are operable to receive the input signal, and wherein the logic gate is operable to generate the pulse at its output.

10. The delay circuitry defined in claim 9, wherein the logic gate comprises a logic exclusive-OR gate.

11. The delay circuitry defined in claim 8, wherein the latching circuit comprises an edge-triggered flip-flop.

12. The delay circuitry defined in claim 8, wherein the latching circuit comprises a level-sensitive latch.

13. The delay circuitry defined in claim 8, wherein the pulse is delayed by a given delay to form the delayed version of the pulse, the delay circuitry further comprising:
control circuitry coupled to the delay circuit, wherein the control circuitry is configured to control the delay circuitry to adjust the given delay.

14. The delay circuitry defined in claim 8, wherein the input signal comprises a clock signal, the delay circuitry further comprising:
an additional delay circuit, wherein the first input of the latching circuit is operable to receive a delayed version of the clock signal through the additional delay circuit.

15. Delay circuitry comprising:
a pulse generation circuit operable to receive an input signal and operable to generate corresponding first and second pulse signals;
a first delay circuit operable to receive the first pulse signal;
a second delay circuit operable to receive the second pulse signal; and
a latching circuit having a first input and a second input, wherein the first input is operable to receive a delayed version of the first pulse signal through the first delay circuit, wherein the second input is operable to receive a delayed version of the second pulse signal through the second delay circuit, and wherein the latching circuit is operable to output a delayed version of the input signal in response to receiving the delayed version of the first pulse signal and the delayed version of the second pulse signal.

16. The delay circuitry defined in claim 15, wherein the latching circuit comprises a set-reset latch.

17. The delay circuitry defined in claim 15, wherein the first delay circuit is operable to provide a first delay and wherein the second delay circuit is operable to provide a second delay, the delay circuitry further comprising:
control circuitry coupled to the first and second delay circuits, wherein the control circuitry is configured to adjust the first and second delays provided by the first and second delay circuits.

18. The delay circuitry defined in claim 15, wherein the pulse generation circuit comprises:
a first logic circuit associated with the first delay circuit, wherein the first logic circuit has a first input operable to receive the input signal and a second input;
a second logic circuit associated with the second delay circuit, wherein the second logic circuit has a first input operable to receive the input signal and a second input; and
an additional delay circuit, wherein the additional delay circuit has an input operable to receive the input signal and wherein the additional delay circuit has an output coupled to the second input of the first logic circuit and the second input of the second logic circuit.

19. The delay circuitry defined in claim 18, wherein the first circuit comprises a first NAND gate and a first inverter.

20. The delay circuitry defined in claim 19, wherein the second circuit comprises a second NAND gate, a second inverter, and an additional logic circuit and wherein the additional logic circuit is configured to provide a delay to the input signal that is equal to a delay associated with signals passing through the first inverter.

21. The delay circuitry defined in claim 20, wherein the input signal comprises a clock signal and wherein the additional circuit comprises a pass gate.

* * * * *